United States Patent [19]
Washiyama

[11] Patent Number: 5,061,926
[45] Date of Patent: Oct. 29, 1991

[54] AD CONVERTER USING SUCCESSIVE COMPARISON

[75] Inventor: Yutaka Washiyama, Hamamatsu, Japan

[73] Assignee: Kawai Musical Instruments Man. Co. Ltd., Japan

[21] Appl. No.: 427,619

[22] Filed: Oct. 26, 1989

[30] Foreign Application Priority Data

Nov. 7, 1988 [JP] Japan .................................. 63-281033

[51] Int. Cl.$^5$ ............................................ H03M 1/00
[52] U.S. Cl. .................................... 341/122; 341/163; 341/164; 341/165; 341/141
[58] Field of Search ............... 341/163, 122, 164, 165, 341/141

[56] References Cited

U.S. PATENT DOCUMENTS 4,594,576  6/1986  Fujii ..................................... 341/163

FOREIGN PATENT DOCUMENTS

0090522  5/1986  Japan .................................... 341/122
0164747 12/1985  United Kingdom ................ 341/163

Primary Examiner—Benjamin R. Fuller
Assistant Examiner—Nancy Le

[57] ABSTRACT

A successive comparison type analog-to-digital (AD) converter having a successive comparing circuit which is implemented by two successive comparators, and having a parallel two sequence AD conversion capability while adapting itself to another conversion system at the same time as needed. The successive comparators are not expensive and are, therefore, sucessful in constituting an inexpensive successive comparison type AD converter.

2 Claims, 8 Drawing Sheets

AD CONVERTER USING SUCCESSIVE COMPARISON

BACKGROUND OF THE INVENTION

The present invention relates to a successive comparison type analog-to-digital (AD) converter having a successive comparing circuit which is implemented by two successive comparators, and thereby achieving a parallel two sequence AD conversion capability while adapting itself to another conversion system at the same time as needed.

Many of modern audio systems have a digital reverberation system or similar system in which two AD converters are built. AD converters available today are more expensive than digital-to-analog (DA) converters, so that an audio system implemented by such AD converters is expensive also.

SUMMARY OF THE INVENTION

It is therefore an object of the present invention to provide an inexpensive successive comparison type AD converter by using relatively inexpensive successive comparators.

It is another object of the present invention to provide a generally improved successive comparison type AD converter.

A successive comparison type AD converter of the present invention comprises a pair of sample and holding circuits for dividing an analog input signal with respect to time and each sampling and holding the divided analog input signal at a different timing, a pair of comparators each being supplied with an output of respective one of the pair of sample and holding circuits, a successive comparing circuit comprising a pair of successive comparators each being supplied with an output of respective one of the pair of comparators, a latch circuit supplied with an output of the successive comparing circuit, and a DA converter connected to an output of the latch.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
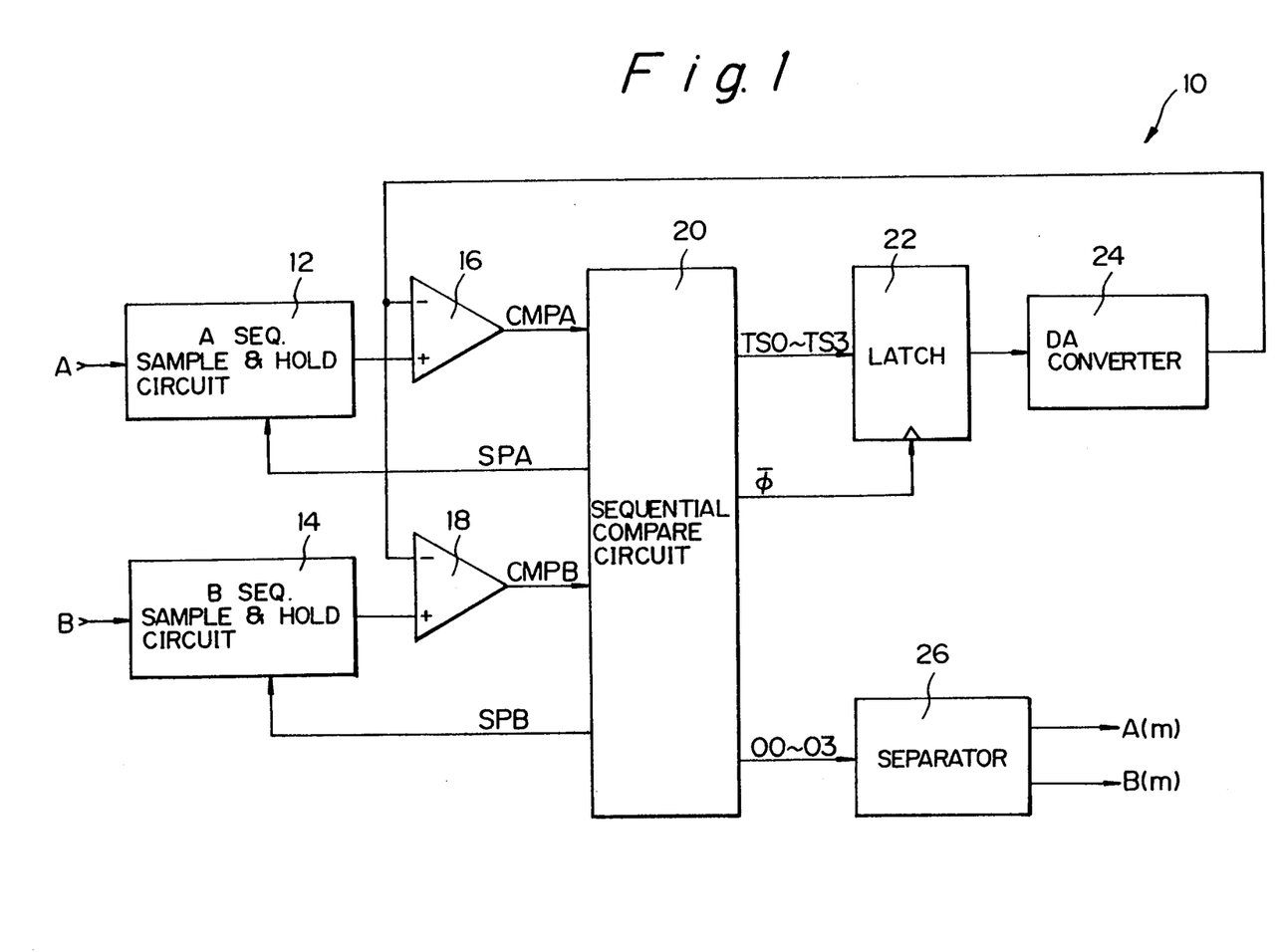
FIG. 1 is a schematic block diagram showing an embodiment of the successive comparison type AD converter in accordance with the present invention.

Referring to FIG. 1 of the drawings, a successive comparison type AD converter embodying the present invention is shown and generally designated by the reference numeral 10. As shown, the AD converter 10 is made up of an A sequence sample and holding circuit 12, a B sequence sample and holding circuit 14, an A sequence comparator 16, a B sequence comparator 18, a successive comparing circuit 20, a latch 22, a DA converter 24, and a separator 26. The A sequence and B sequence comparators 16 and 18 produce comparison signals CMPA and CMPB, respectively. The successive comparing circuit 20 outputs an A sequence sampling signal SPA, a B sequence sampling signal SPB, comparison output signals TS0 to TS3, digital output signals O0 to O3, and an inverted signal $\bar{\phi}$ of a fundamental clock. The separator 26 separates the digital signals O0 to O3 to produce A sequence data A(m) and B sequence data B(m) each being representative of the result of AD conversion which is effected by the m-th sampling.

Basically, the AD converter 10 is constituted by two sample and holding circuits 12 and 14, two successive comparators, a single latch 22, and a single DA converter 24. The successive comparing circuit 20 shown in FIG. 1 is representative of the two successive comparators, i.e., it has two successive comparators respectively assigned to the A and B sequences thereinside. The successive comparators constituting the successive comparing circuit 20 have a conventional construction. Specifically, each of such comparators has a memory thereinside which is loaded with predetermined digital signal levels. The comparator successively compares an input analog signal with the predetermined signal levels, determines a level range associated with the analog signal on the basis of the result of comparison, and then converts the analog signal into a digital signal.

Two analog signals A and B are applied to the AD converter 10 from the left-hand side as viewed in FIG. 1. The analog signals A and B are sampled alternately with each other by an A sequence sampling signal SPA and a B sequence sampling signal SPB, respectively. The successive comparing circuit 20 transforms the sampled analog signals A and B into digital output signals O0 to O3. The separator 26 separates the digital signals O0 to O3 to produce data A(m) and B(m) representative of the results of AD conversion of the A and B sequences, respectively.

Figure 2:
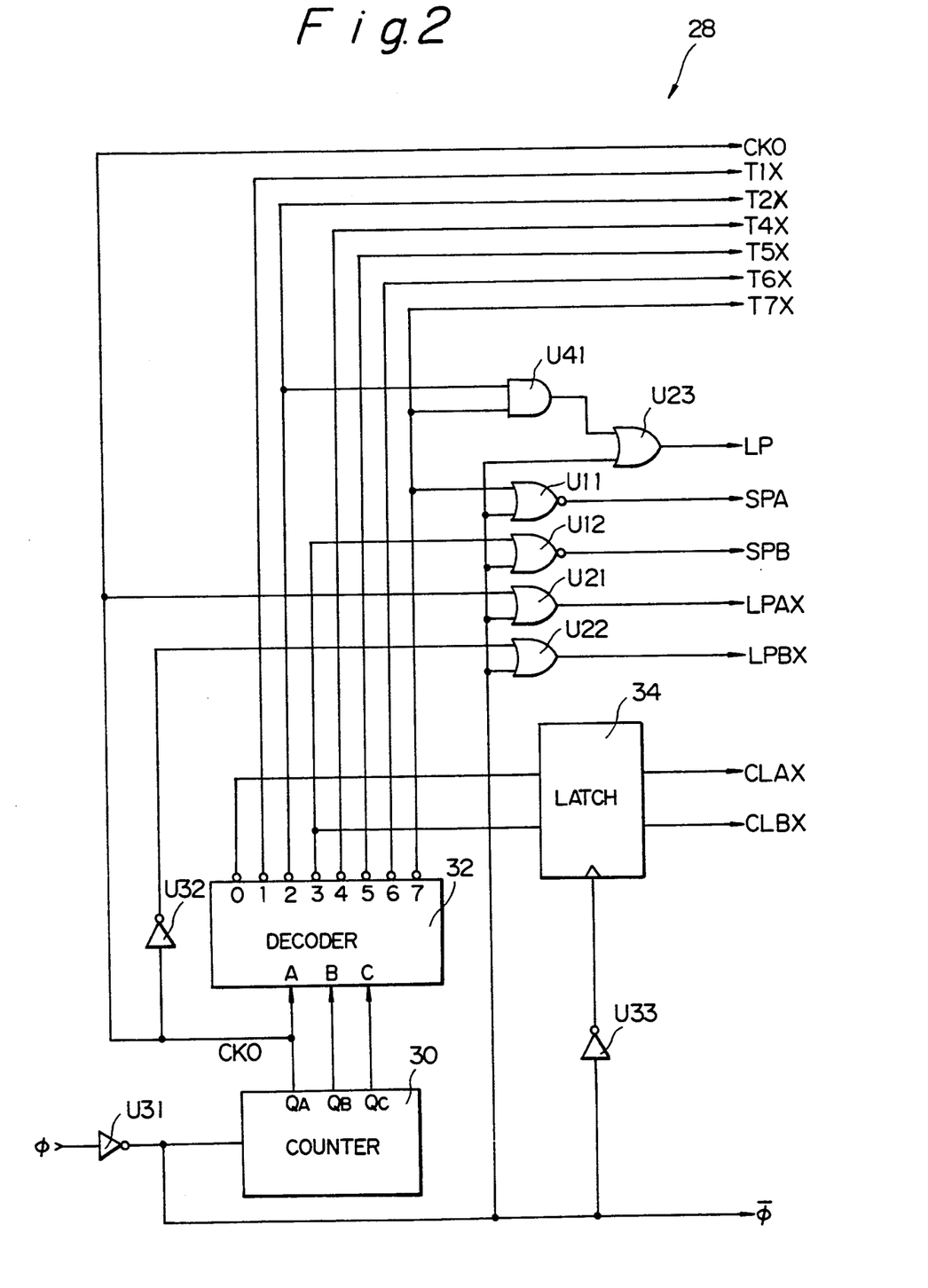
FIG. 2 is a schematic block diagram showing a specific arrangement of a timing signal generator which is a peripheral circuit of a successive comparing circuit as shown in FIG. 1.

FIG. 2 indicates a specific construction of a timing generator which is a peripheral circuit of the successive comparing circuit 20 shown in FIG. 1. The timing generator, generally 28, is made up of a counter 30, a decoder 32, a latch 34, NOR gates U11 and U12, OR gates U21 to U23, inverters U31 to U33, and an AND gate U41. The counter 30 divides the frequency of a fundamental clock $\bar{\phi}$ to produce first clock pulses CK0. The decoder 32 produces output signals T1X to T7X. The OR gate U23 delivers a latch pulse signal LP adapted for an output. The OR gates U21 and U22 output respectively A sequence and B sequence latch pulse signals LPAX and LPBX assigned to the A and B sequences. The latch 34 produces an A sequence and a B sequence reset signal CLAX and CLBX, respectively.

The correspondence of the timing signal generator 28 shown in FIG. 2 and the successive comparison type AD converter 10 shown in FIG. 1 is as follows. The NOR gates U11 and U12 shown in FIG. 2 generate respectively the A sequence and B sequence sampling signals SPA and SPB which are shown in FIG. 1 as being fed from the successive comparing circuit 20 to the A sequence and B sequence sample and holding circuits 12 and 14. The timing signal generator 28 also produces the inverted signal $\bar{\phi}$ of the fundamental clock $\phi$. Other various outputs of the timing signal generator 28 are applied to the successive comparing circuit 20 a specific construction of which is shown in FIG. 3.

Figure 3:
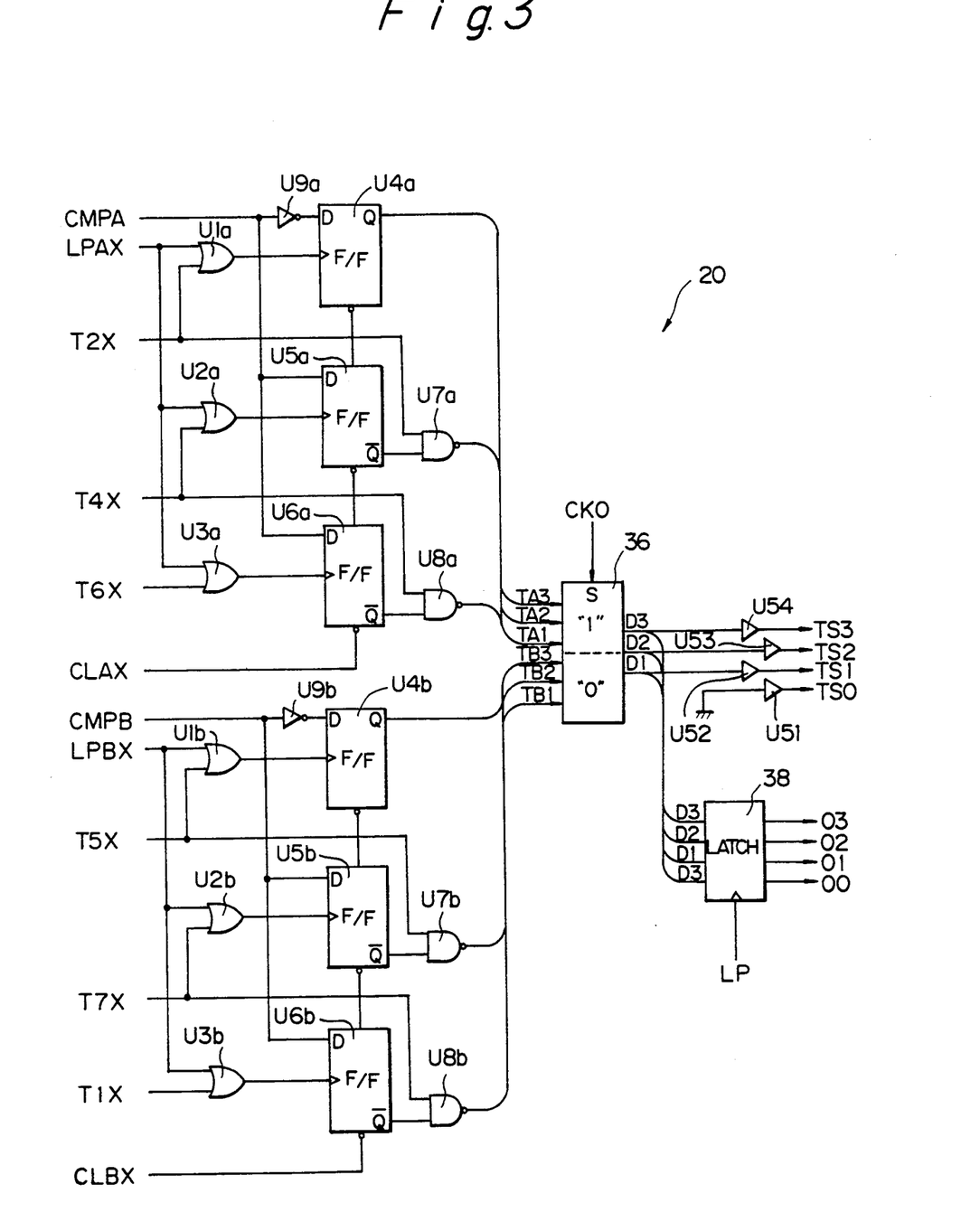
FIG. 3 is a schematic block diagram representative of a specific construction of the successive comparing circuit shown in FIG. 1.

Referring to FIG. 3, the successive comparing circuit 20 has a selector 36, a latch 38, OR gates U1a to U3a and U1b to U3b, D flip-flops U4a to U6a and U4b to U6b, NAND gates U7a and U8a and U7b and U8b, inverters U9a and U9b, and amplifiers U51 to U54. The D flip-flop 4a and NAND gates U7a and U8a which are assigned to the A sequence produce output signals TA1, TA2 and TA3, respectively. The D flip-flop U4b and NAND gates U7b and U8b assigned to the B sequence produce output signals TB1, TB2 and TB3, respectively. Further, the selector 36 produces output signals D1 to D3. As shown in FIG. 3, various kinds of signals are fed from the timing signal generator 28 of FIG. 2 to the successive comparing circuit 20.

Describing the circuitry of FIG. 3 in relation to FIG. 1, the comparison output CMPA of the A sequence comparator 16 is indicated at the top left of FIG. 3 and fed to D terminals of the A sequence D flip-flops U4a to U6a with or without the intermediary of the inverter U9a. Shown at the center left of FIG. 3, the comparison output CMPB of the B sequence comparator 18 is fed to D terminals of the B sequence D flip-flops U4b to U6b with or without the intermediary of the inverter 9b. The other signals indicated at the left-hand side of FIG. 3 are delivered from the timing signal generator 28 shown in FIG. 2. Specifically, the A sequence latch pulse signal LPAX from the OR gate U21 shown in FIG. 2 is applied to the OR gates U1a to U3a of FIG. 3, while the B sequence latch pulse signal LPBX from the OR gate U22 is applied to the OR gates U1b to U3b of FIG. 3.

Among the output signals T1X to T7X of the decoder 32 shown in FIG. 2, the even outputs as distinguished from odd outputs are fed to the A sequence OR gates U1a to U3a and NAND gates U7a and U8a of FIG. 3 in the illustrated order, whereby the A sequence output signals TA1 to TA3 are produced. On the other hand, the odd outputs are fed to the B sequence OR gates U1b to U3b and NAND gates U7a and U8b in the illustrated order, whereby the B sequence output signals TB1 to TB3 are produced. The A sequence reset signal CLAX from the latch 34 of FIG. 2 is routed to reset terminals of the D flip-flops U4a to U6a of FIG. 3, while the B sequence reset signal CLBX is routed to reset terminals of the D flip-flops U4b to U6b.

The first clock pulse CK0 appearing on a terminal QA of the counter 30 shown in FIG. 2 is applied to a select terminal S of the selector 36 of FIG. 3, causing the selector 36 to select the A sequence and B sequence output signals TA1 to TA3 and TB1 to TB3 alternately. Hence, the selector 36 produces output signals D1 to D3 which are the A sequence and B sequence output signals TA1 to TA3 and TB1 to TB3 that alternate with each other. The signals D1 to D3 are fed to the latch 38. The latch pulse signal LP from the OR gate U23 shown in FIG. 2 is delivered to one input terminal of the latch 38. Therefore, the output signals D1 to D3 of the selector 36 are latched in synchronism with the latch pulse signal LP, resulting in the digital output signals O0 to O3 being produced.

Figure 4:
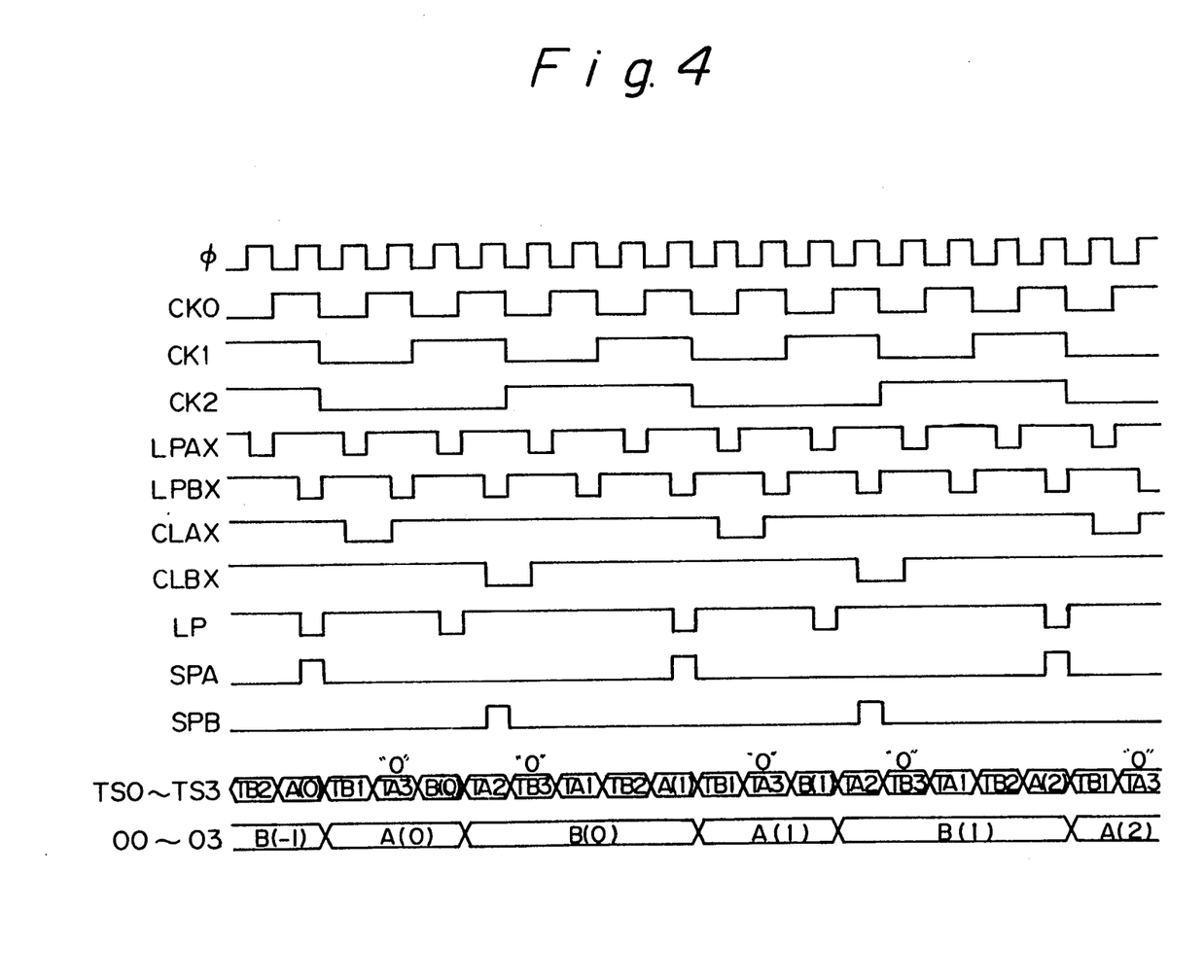
FIG. 4 is a timing chart useful for understanding the operation of the illustrative embodiment.

Referring to FIG. 4, the operation of the illustrative embodiment will be described. In the timing chart of FIG. 4, the symbols each labeling a different waveform correspond to the symbols shown in FIGS. 1 and 3. As shown, in the AD converter 10, the input two analog signals A and B are alternately picked up by the A sequence and B sequence sampling signals SPA and SPB, and the successive comparing circuit 20 outputs digital signals TS0 to TS3. In the output signals TS0 to TS3 and the AD digital output signals O0 TO O3, TAn (n=1 to 3) and TBn (n=1 to 3) are respectively representative of the n-th bit check data of the A and B sequences, while A(m) (m=0, 1, 2, ...) and B(m) (m=0, 1, 2, ...) are respectively representative of the result data of A and B sequence AD conversion provided by the m-th sampling.

The output signals TS0 to TS3 are the output signals of the selector 36 shown in FIG. 3. The signals TS0 to TS3 are the A sequence and B sequence output signals TA1 to TA3 and TB1 to TB3 and produced by the amplifiers U51 to U54, respectively. Simultaneously, the A sequence and B sequence output signals TA1 to TA3 and TB1 to TB3 are fed from the selector 36 to the latch 38. Then, the latch 38 latches only the AD conversion result data included in the input data D1 to D3 in response to the latch pulse signal LP, thereby producing output signals O0 to O3. More specifically, as shown in FIG. 4, the latch 38 produces digital output signals O0 to O3 representative of the results of AD conversion, e.g., B(−1), A(0), B(0), A(1), B(1), A(2), ... The separator 26 shown in FIG. 1 separates the time division multiplexed signal B(−1), A(0), B(0), A(1), B(1), A(2), ... to output A sequence and B sequence AD conversion result data A(m) and B(m).

The illustrative embodiment deals with two independent analog signals A and B of FIG. 1 and deliver them to the A sequence and B sequence sample and holding circuits 12 and 14 to produce A sequence and B sequence AD conversion result data A(m) and B(m). Alternatively, it may deal with a single common analog signal in which case the single analog signal can be converted at a twice higher sampling rate into a digital signal. If necessary, the output signals TS0 to TS3 shown in FIG. 4 may be outputted in the form of a serial signal by use of a commercially available serial AD converter.

Figure 5:
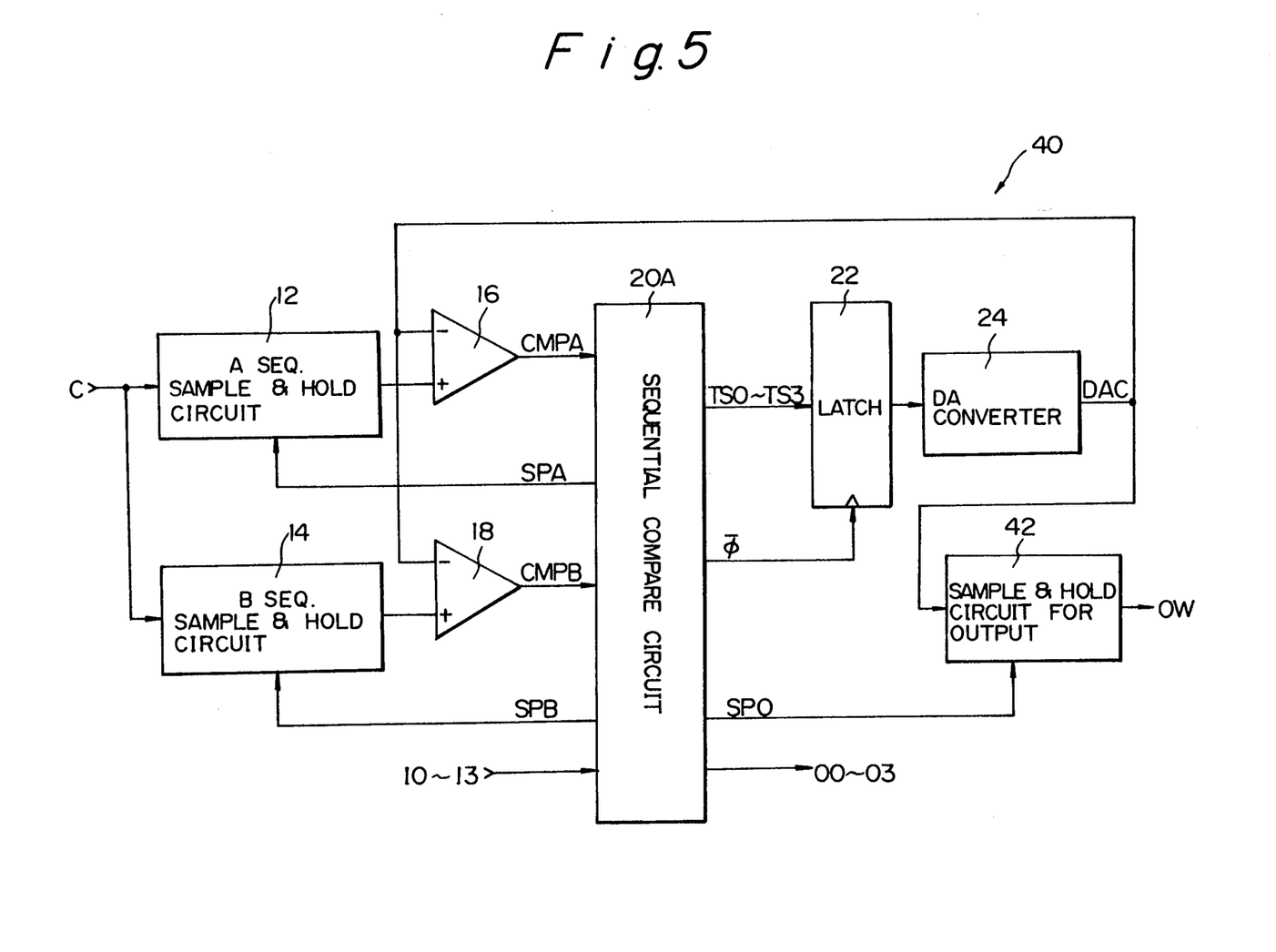
FIG. 5 is a schematic block diagram showing an alternative embodiment of the present invention.

Referring to FIG. 5, an alternative embodiment of the present invention is shown. In the figure, the same components as those shown in FIG. 1 are designated by like reference numerals, and redundant description will be omitted for simplicity. The successive comparison type AD converter, generally 40, handles a single analog signal and processes it at a twice higher sampling rate than the AD conerter 10 of FIG. 1. Specifically, a single input analog signal C is picked up by the A sequence and B sequence sampling signals SPA and SPB alternately, and a digital output signal representative of the result of AD conversion is produced by the DA converter 24. An extra sample and holding circuit 42 is connected to the output of the DA converter 24 so that another output signal may be obtainable from the circuit 42 also. The DA converter 24 produces an output signal DAC. Second input signals I0 to I3 are applied to a successive comparing circuit 20A. A sampling signal SPO is fed to the sample and holding circuit 42 which is adapted for an output. In response, the sample and holding circuit 42 produces a second output signal OW.

The sampling signal SPO generally corresponds to a combination of the sampling signals SPA and SPB. The sample and holding circuit 42 samples and holds the analog output signal DAC during both the A sequence and B sequence timings such that the second output signal OW constitutes an analog version of the digital signals O0 to O3 which include the A sequence and B sequence signals A(m) and B(m) in combination.

Figure 6:
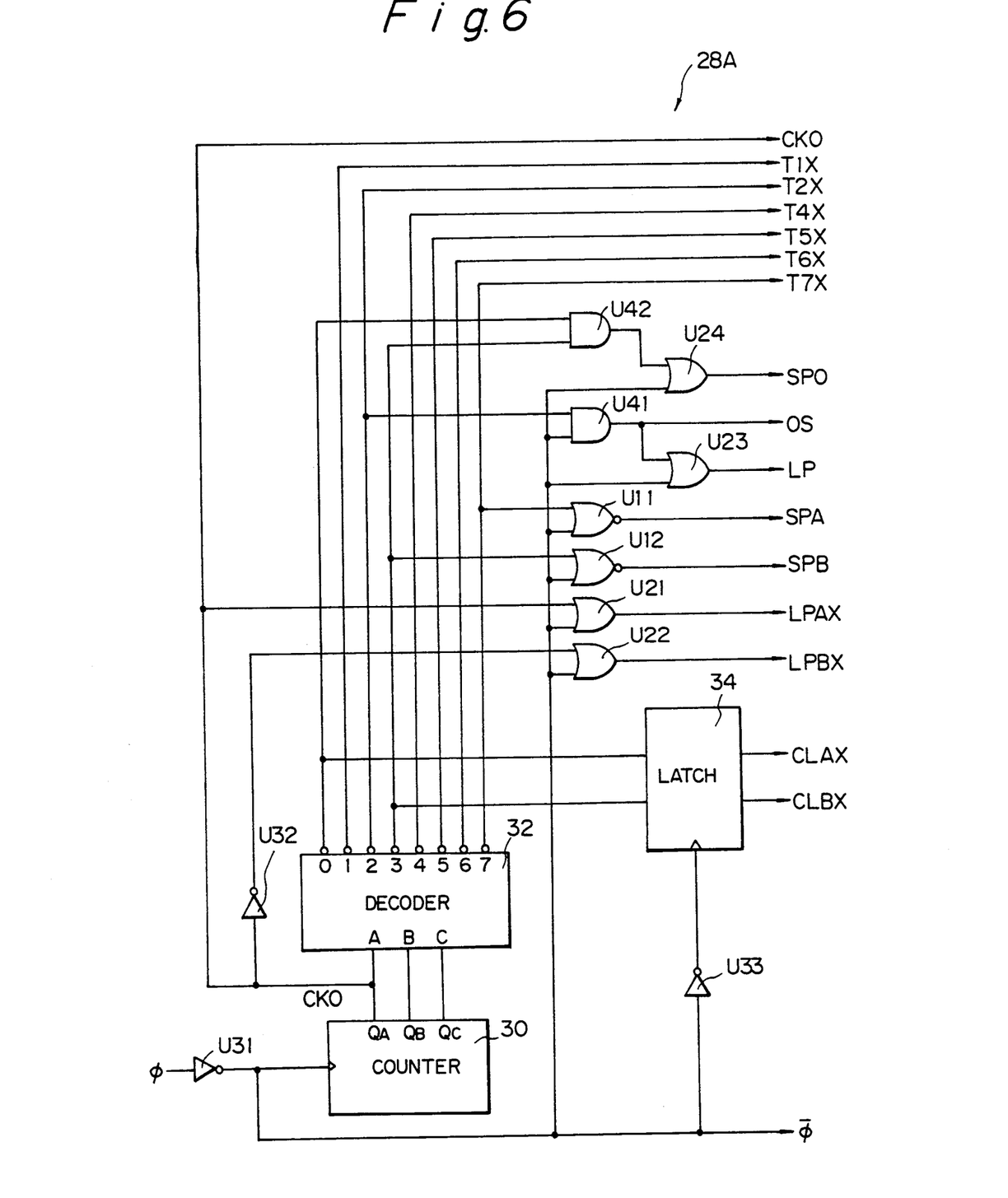
FIG. 6 is a schematic block diagram showing a specific construction of a timing signal generator which is a peripheral circuit of a successive comparing circuit as shown in FIG. 5.

FIG. 6 shows a specific construction of a timing signal generator 28A which is a peripheral circuit of the successive comparing circuit 20 shown in FIG. 5. The symbols shown in FIG. 6 are the same as the symbols of FIG. 2 except for U24, U42 and OS which indicate an OR gate, an AND gate, and a select signal, respectively. The select signal OS is fed from the AND gate U41 to a selector 44, FIG. 7. The timing signal generator 28A is essentially the same in construction as the timing signal generator 28 of FIG. 2 except that, in conformity to the modification of the circuitry as shown in FIG. 5, it produces the sampling signal SPO for the extra sample and holding circuit 42 and the select signal OS for the selector 44.

Figure 7:
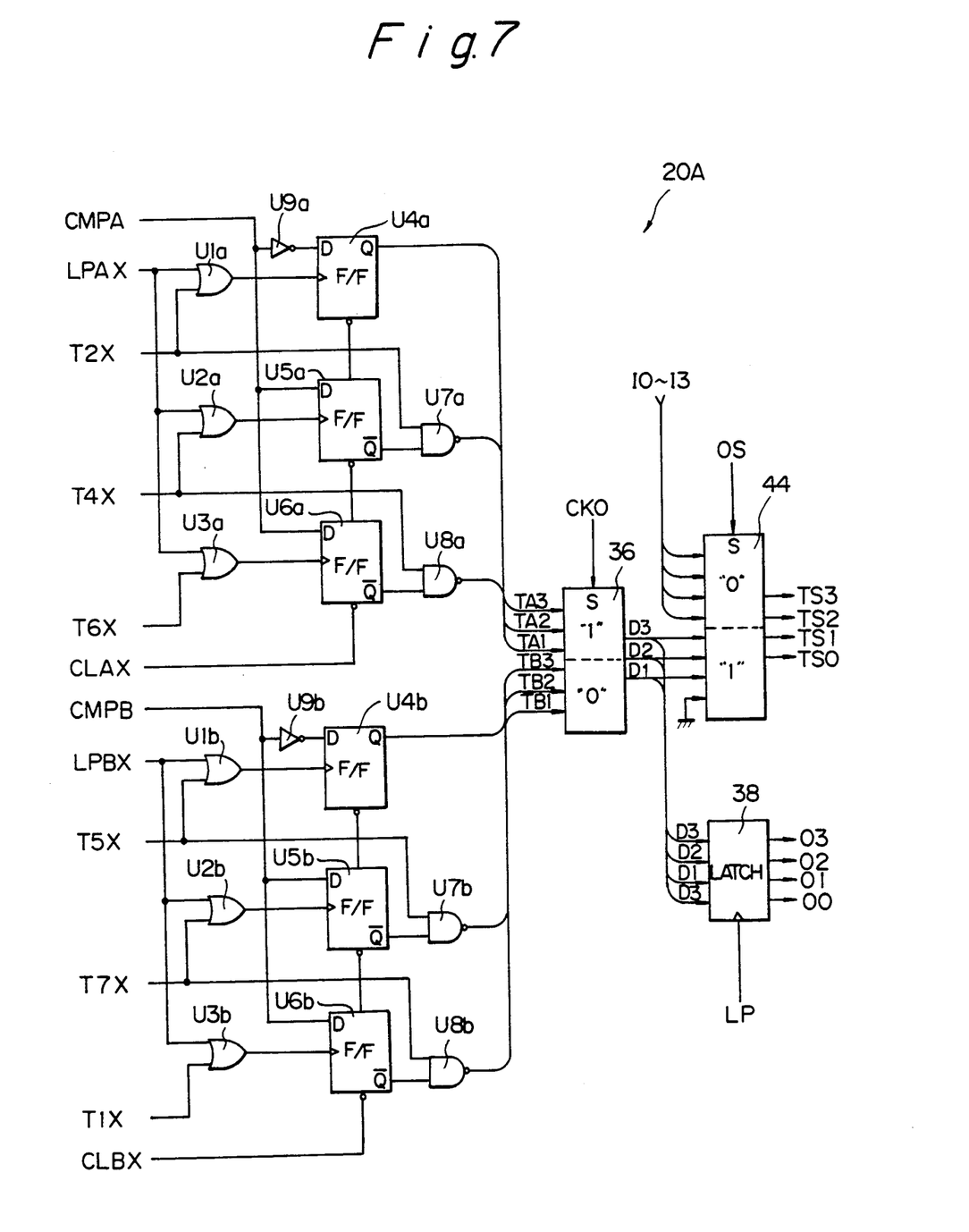
FIG. 7 is a schematic block diagram showing a specific construction of the successive comparing circuit of FIG. 5.

Referring to FIG. 7, a specific construction of a successive comparing circuit 20A shown in FIG. 5 will be described. In the figure, the same components as those shown in FIG. 3 are designated by like reference numerals, and redundant description will be avoided for simplicity. As shown, the selector 36 is followed by another selector 44. The output signals D1 to D3 of the preceding selector 36 and another sequence of digital signal I0 to I3 are applied to the selector 44. Specifically, the other sequence of input data I0 to I3 is fed to a (logical) "0" side of the selector 44, while the output signals D1 to D3 of the selector 36 are applied to a (logical) "1" side. The selector 44 selects the input signals in response to the select signal OS which is fed thereto from the AND gate U41 of FIG. 6, thereby producing output signals TS0 to TS3.

The rest of the construction and operation of the successive comparing circuit 20A is the same as the circuitry shown in FIG. 3.

Figure 8:
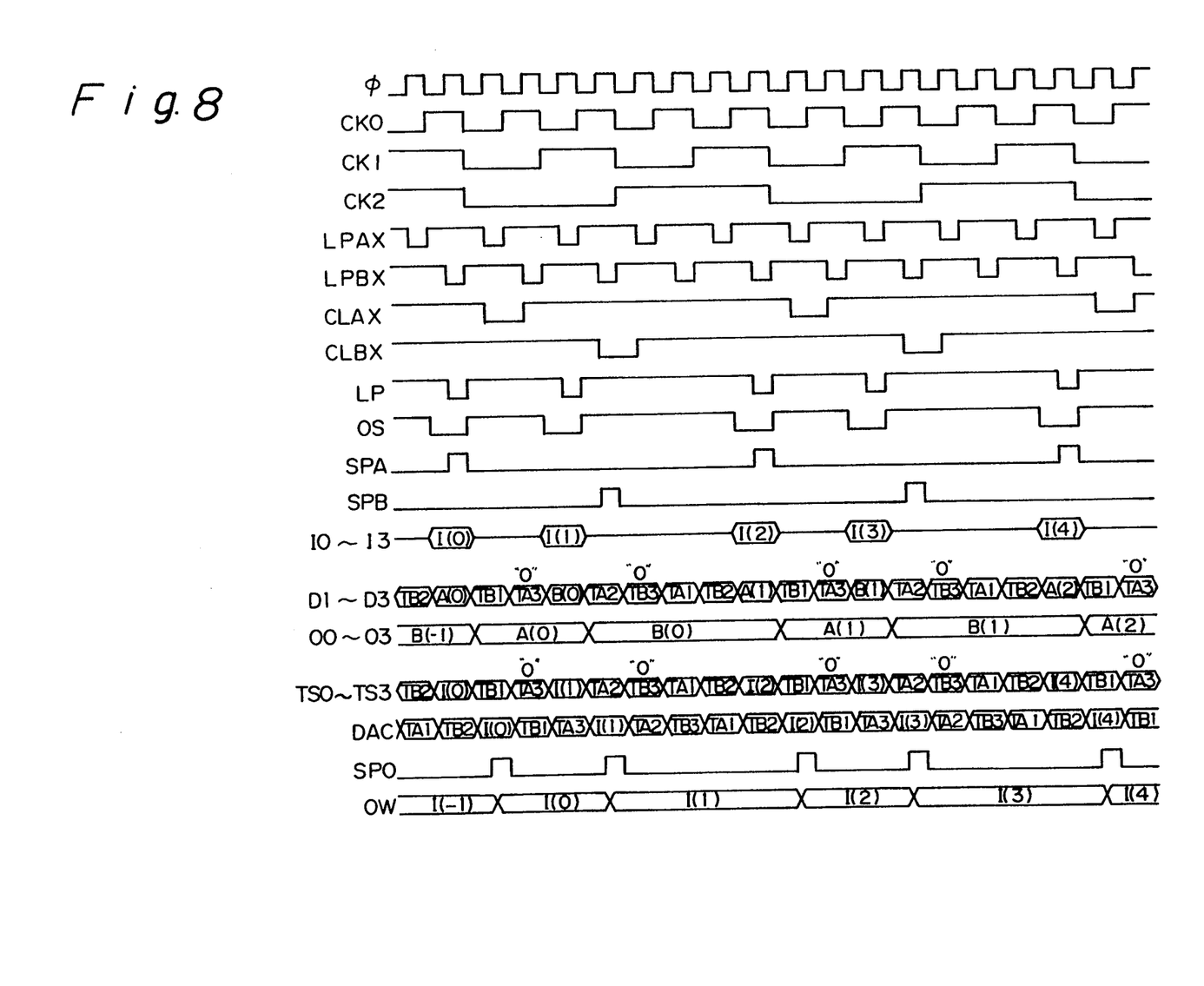
FIG. 8 is a timing chart demonstrating the operation of the alternative embodiment.

The operation of the AD converter 40 having the above construction will be described with reference to FIG. 8. Symbols indicated in FIG. 8 correspond to those shown in FIGS. 5 to 7. When the select signal OS fed to the selector 44 is in "1", the selector 44 selects the output signals TA1 to TA3 and TB1 to TB3 in the order shown in the figure and produces them as signals TS0 to TS3. More specifically, as in the first embodiment, the A sequence output signals TA1 to TA3 and the B sequence output signals TB1 to TB3 are outputted alternately as output signals D1 to D3 of the selector 36 shown in FIG. 7 and fed to the latch 38. While the digital outputs O0 to O3 of the latch 38 are the A sequence and B sequence AD conversion result data A(m) and B(m), it will be apparent that the input signal which is a single analog signal C is processed at a twice higher sampling rate.

When the select signal OS is in "0", the selector 44 selects the input signals I0 to I3 to produce a second output signal i(t) (t=0, 1, 2, ... ). Here, i(t) (t=0, 1, 2, ... ) indicates the t-th input/output signal of the second input signals I0 to I3. More specifically, the sample and holding circuit 20A shown in FIG. 5 produces outputs i(−1), i(0), i(1), i(2), i(3), i(4), ... , as indicated by OW in FIG. 8. The output signal OW is derived from the output DAC of the DA converter 24 which is sampled by the sampling signal SPO, i.e., the other input signal sequence I0 to I3 shown in FIG. 5 is the second output signal OW.

The alternative embodiment described above is so constructed and arranged as to apply a single analog signal C shown in FIG. 5 to both the A sequence and B sequence sample and hold circuits 12 and 14. To promote the ease of understanding, however, the single analog signal C is represented by the A sequence and B sequence analog signals in association with the first embodiment. In practice, as shown in FIG. 5, the A and B sequences are comprised of the same waveform; waveforms sampled by the A sequence and B sequence sampling signals SPA and SPB shown in FIG. 8 are subjected to AD conversion. It follows that the B sequence is sampled during the sampling period of the A sequence (substantially at the intermediate). In this respect, the sampling rate is doubled. Further, since it is easy to serialize the output signals TS0 to TS3 of the second selector 44, this particular embodiment is adaptive to a commercially available DA converter.

In summary, the present invention implements an AD converter which is relatively expensive by use of relatively inexpensive successive comparators. Since such a successive comparison type AD converter of the present invention has a pair of AD converters therein, a system of the type effecting AD conversion with an A sequence and a B sequence analog signal may share the AD converter to substantially halve the cost of a single AD converter. When the AD converter shares an input analog signal, it will double the sampling rate and thereby the conversion efficiency. In addition, the present invention is practicable with a commercially available DA converter.

Various modifications will become possible for those skilled in the art after receiving the teachings of the present disclosure without departing from the scope thereof.

What is claimed is:

1. A successive comparison type AD converter comprising:
    a plurality of sample and holding circuits for sampling and holding an analog input signal at different respective timings;
    a plurality of comparators each being supplied as a first input with an output of a respective one of said sample and holding circuits;
    a successive comparing circuit comprising a plurality of successive comparators each being supplied with an output of a respective one of said plurality of comparators;
    a latch circuit for selectively latching an output of said successive comparing circuit in accordance with said different respective timings; and
    a DA converter supplied with an output of said latch circuit to produce a DA conversion output, said plurality of comparators each being further supplied as a second input with said DA conversion output of said DA converter.

2. An AD converter as claimed in claim 1, further comprising a additional sample and holding circuit for sampling and holding said DA conversion output of said DA converter.

* * * * *